US011127614B2

(12) United States Patent
Kawabe

(10) Patent No.: US 11,127,614 B2
(45) Date of Patent: Sep. 21, 2021

(54) SUBSTRATE TRANSFER METHOD AND SUBSTRATE TRANSFER APPARATUS

(71) Applicant: TOKYO ELECTRON LIMITED, Tokyo (JP)

(72) Inventor: Atsushi Kawabe, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 202 days.

(21) Appl. No.: 16/407,509

(22) Filed: May 9, 2019

(65) Prior Publication Data
US 2019/0355604 A1 Nov. 21, 2019

(30) Foreign Application Priority Data

May 16, 2018 (JP) .............................. JP2018-094888

(51) Int. Cl.
| | | |
|---|---|---|
| H01L 21/677 | (2006.01) | |
| H01L 21/67 | (2006.01) | |
| H01L 21/68 | (2006.01) | |
| B65G 47/90 | (2006.01) | |
| H01L 23/544 | (2006.01) | |

(52) U.S. Cl.
CPC ...... *H01L 21/67742* (2013.01); *B65G 47/905* (2013.01); *H01L 21/67167* (2013.01); *H01L 21/67196* (2013.01); *H01L 21/67201* (2013.01); *H01L 21/67259* (2013.01); *H01L 21/681* (2013.01); *H01L 23/544* (2013.01); *H01L 2223/54426* (2013.01); *H01L 2223/54493* (2013.01)

(58) Field of Classification Search
None
See application file for complete search history.

(56) References Cited

U.S. PATENT DOCUMENTS 6,013,112 A * 1/2000 Iizuka ............... H01L 21/67781
29/25.01
6,405,101 B1 * 6/2002 Johanson ............. H01L 21/681
356/73

(Continued)

FOREIGN PATENT DOCUMENTS

JP 2004193344 7/2004
JP 2004193344 A * 7/2004

*Primary Examiner* — Gerald McClain
(74) *Attorney, Agent, or Firm* — Nath, Goldberg & Meyer; Jerald L. Meyer; Tanya E. Harkins

(57) ABSTRACT

A substrate transfer method includes: acquiring sensing information from a sensor by moving a substrate by a robot arm such that the substrate passes through a sensing region; calculating a center position of the substrate with respect to the robot arm based on the sensing information; detecting a marker indicating a reference direction of the substrate by the sensor by controlling the robot arm to rotate the substrate about the center position in a state where an edge of the substrate is located in the sensing region; calculating a direction of the substrate with respect to the robot arm based on a position of the marker; calculating a correction amount based on the center position and the direction of the substrate; and placing the substrate on the stage in the processing chamber such that the center position and the direction of the substrate are corrected according to the correction amount.

9 Claims, 15 Drawing Sheets

(56) References Cited

U.S. PATENT DOCUMENTS

| | | | | |
|---|---|---|---|---|
| 7,095,496 B2* | 8/2006 | Sezginer | ............... | G01N 21/274 |
| | | | | 356/237.2 |
| 7,963,736 B2* | 6/2011 | Takizawa | .......... | H01L 21/68707 |
| | | | | 414/217 |
| 8,253,948 B2* | 8/2012 | Kiley | ..................... | B65G 37/00 |
| | | | | 356/614 |
| 8,634,633 B2* | 1/2014 | Kiley | ................ | H01L 21/67748 |
| | | | | 382/141 |
| 8,897,906 B2* | 11/2014 | Ohashi | .............. | H01L 21/67742 |
| | | | | 700/103 |
| 9,196,518 B1* | 11/2015 | Hofmeister | ........... | H01L 21/677 |
| 10,002,781 B2* | 6/2018 | Moura | .............. | H01L 21/67742 |
| 10,651,065 B2* | 5/2020 | Hiester | ............. | H01L 21/67161 |
| 2006/0100740 A1* | 5/2006 | Sakiya | ................... | B25J 9/1692 |
| | | | | 700/246 |
| 2019/0172738 A1* | 6/2019 | Hiester | ............. | H01L 21/67201 |

* cited by examiner

SUBSTRATE TRANSFER METHOD AND SUBSTRATE TRANSFER APPARATUS

CROSS-REFERENCE TO RELATED APPLICATION

This application is based upon and claims the benefit of priority from Japanese Patent Application No. 2018-094888, filed on May 16, 2018, the entire contents of which are incorporated herein by reference.

TECHNICAL FIELD

Various aspects and embodiments of the present disclosure relate to a substrate transfer method and a substrate transfer apparatus.

BACKGROUND

In a semiconductor device manufacturing process, a semiconductor substrate as a workpiece (hereinafter referred to as a "substrate") is subjected to various treatments in a plurality of steps. In each of the steps, the substrate is transferred to an apparatus that performs a corresponding treatment. The transfer of the substrate is performed by, for example, a robot arm.

The position of the substrate in a substrate processing apparatus affects characteristics of the substrate after being processed. Thus, in order to suppress variations in characteristics between substrates, it is desirable to load the substrates to a uniform position in the substrate processing apparatus. However, when a substrate is placed on a mounting table and makes an excessively close contact with the mounting table, the substrate may in some cases jump upward when the substrate is moved upward from the mounting table by lift pins and deviate in position with respect to the mounting table. When the position of the substrate deviates with respect to the mounting table, the position of the substrate also deviates with respect to a fork installed at a tip end of a robot arm that receives the substrate from the lift pins. The position of the substrate may also deviate with respect to the fork due to the movement of the fork by the robot arm, when the substrate is in a low level of contact with the fork. When the position of the substrate deviates with respect to the fork, it is difficult to place substrates at a uniform position in the substrate processing apparatus.

There is known a technique for avoiding the above-described problems. In the technique, a substrate is transferred to an appropriate position and in an appropriate direction by detecting positions of the center and a notch of the substrate by a line sensor and calculating amounts of positional deviation and rotational deviation of the substrate based on the detected positions of the center and the notch of the substrate.

However, it is difficult to install a line sensor in a vacuum transfer chamber because the line sensor causes generation of particles and unnecessary gases. Thus, in many cases, the line sensor is installed outside the vacuum transfer chamber. In such cases, it is necessary to install a window in the vacuum transfer chamber to transmit light emitted from the line sensor. However, since the line sensor has multiple light sources, a large amount of area in the vacuum transfer chamber is occupied by the window. Therefore, it is difficult to secure airtightness of the vacuum transfer chamber.

SUMMARY

According to one aspect of the present disclosure, there is provided a substrate transfer method including: acquiring sensing information from at least one sensor by moving a substrate by a robot arm disposed in a vacuum transfer chamber such that the substrate passes through a sensing region, which is a region located in the vacuum transfer chamber and sensed by the at least one sensor; calculating a center position of the substrate with respect to the robot arm based on the sensing information; detecting a marker indicating a reference direction of the substrate by the at least one sensor by controlling the robot arm to rotate the substrate about the center position in a state in which an edge of the substrate is located in the sensing region; calculating a direction of the substrate with respect to the robot arm based on a position of the marker; calculating a correction amount for use in placing the substrate on a stage in a processing chamber connected to the vacuum transfer chamber based on the center position of the substrate and the direction of the substrate; and placing the substrate on the stage in the processing chamber such that the center position of the substrate and the direction of the substrate are corrected according to the correction amount.

According to another aspect of the present disclosure, there is provided a substrate transfer apparatus including: a vacuum transfer chamber; an articulated robot arm installed in the vacuum transfer chamber and configured to transfer a substrate; a sensor configured to detect whether or not the substrate passes through a sensing region in the vacuum transfer chamber; and a controller configured to control the robot arm and the sensor. The controller performs a control to: acquire sensing information from the sensor by moving the substrate by the robot arm such that the substrate passes through the sensing region; calculate a center position of the substrate with respect to the robot arm based on the sensing information; detect a marker indicating a reference direction of the substrate by rotating the substrate about the center position in a state in which an edge of the substrate is located in the sensing region; calculate a direction of the substrate with respect to the robot arm based on a position of the marker; calculate a correction amount for use in placing the substrate on a stage in a processing chamber connected to the vacuum transfer chamber based on the center position of the substrate and the direction of the substrate; and place the substrate on the stage in the processing chamber such that the center position of the substrate and the direction of the substrate are corrected according to the correction amount.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

[Configuration of Substrate Processing System 1]

Figure 1:
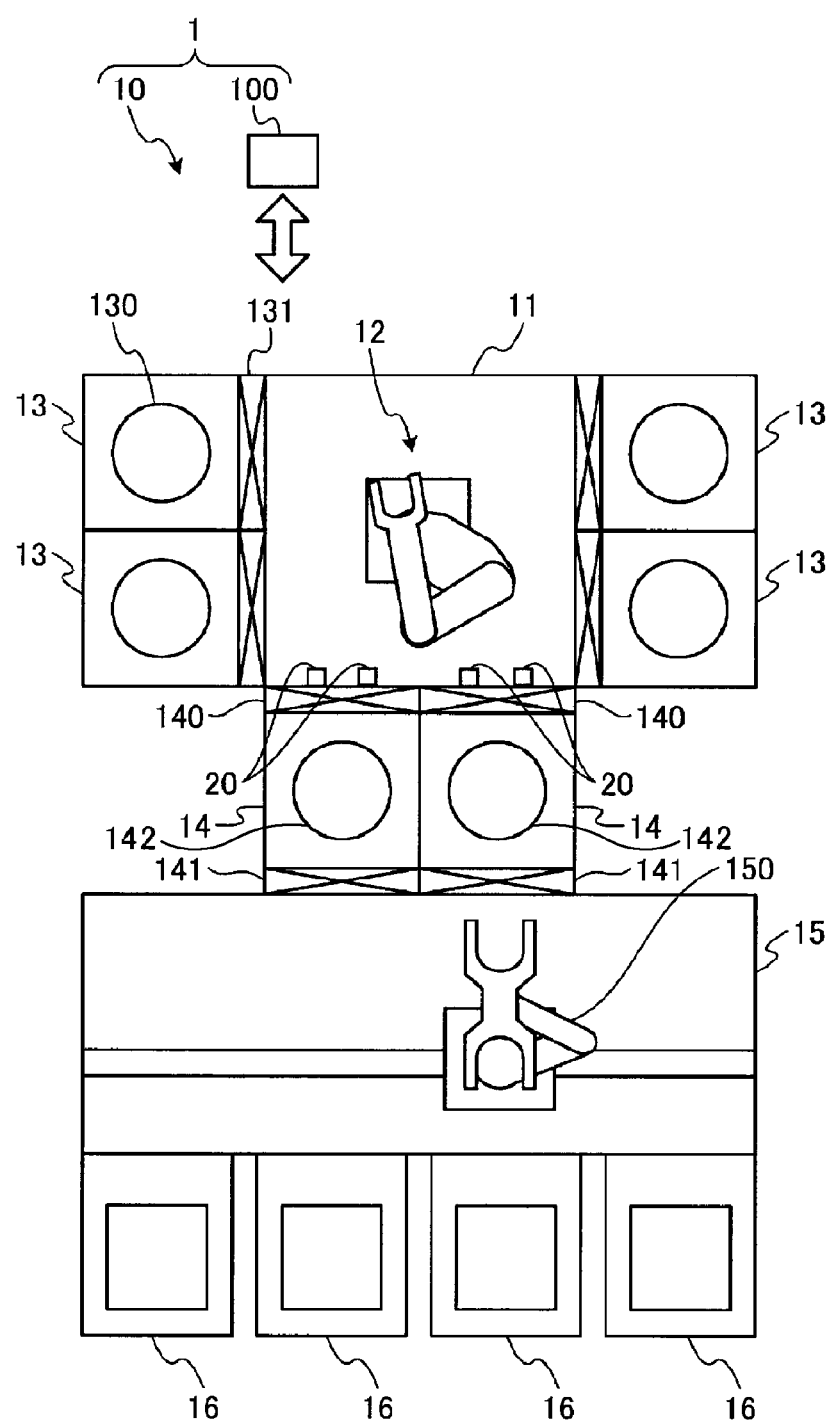
FIG. 1 is a system configuration view illustrating an example of a substrate processing system according to a first embodiment of the present disclosure.

FIG. 1 is a system configuration view illustrating an example of a substrate processing system 1 according to a first embodiment of the present disclosure. In FIG. 1, some internal components are omitted for the ease of explanation. The substrate processing system 1 includes a main body 10 and a control device 100 that controls the main body 10. As illustrated in FIG. 1, for example, the main body 10 includes a vacuum transfer chamber 11, a plurality of process chambers 13, a plurality of load lock chambers 14, and a loader module 15. The substrate processing system 1 is an example of a substrate transfer apparatus.

The plurality of process chambers 13 and the plurality of load lock chambers 14 are connected to the vacuum transfer chamber 11. In the present embodiment, four process chambers 13 are connected to the vacuum transfer chamber 11. However, three or less process chambers 13 may be connected to the vacuum transfer chamber 11, or five or more process chambers 13 may be connected to the vacuum transfer chamber 11. In addition to the plurality of process chambers 13, another vacuum transfer chamber 11 to which a plurality of process chambers 13 are connected may be further connected to the vacuum transfer chamber 11. In the present embodiment, two load lock chambers 14 are connected to the vacuum transfer chamber 11. However, one load lock chamber 14 may be connected to the vacuum transfer chamber 11, or three or more load lock chambers 14 may be connected to the vacuum transfer chamber 11.

The process chambers 13 are configured to perform a treatment such as etching or film formation on the substrate under, for example, a low pressure environment. The process chambers 13 and the vacuum transfer chamber 11 are partitioned so as to be in communication with each other by gate valves 131. Each of the process chambers 13 is an example of a processing chamber. The process chambers 13 may be configured as modules that execute the same step in a manufacturing process, or as modules that execute different steps from one another.

Each of the load lock chambers 14 has doors 140 and 141, and the internal pressure of each of the load lock chambers 14 is switched from a predetermined vacuum degree to atmospheric pressure, or from atmospheric pressure to the predetermined vacuum degree. Each of the load lock chambers 14 and the vacuum transfer chamber 11 are partitioned so as to be in communication with each other by the door 140. Each of the load lock chambers 14 and the loader module 15 are partitioned so as to be in communication with each other by the door 141.

The vacuum transfer chamber 11 is provided with a plurality of sensors 20. Further, a robot arm 12 is disposed in the vacuum transfer chamber 11. The inside of the vacuum transfer chamber 11 is kept at a predetermined vacuum degree. In the present embodiment, the robot arm 12 has three articulations, each of which can be independently driven. The robot arm 12 may have four or more articulations, each of which can be independently driven. The robot arm 12 takes out a substrate before being processed from the inside of one of the load lock chambers 14, which has been depressurized to a predetermined vacuum degree, and transfers the substrate into one of the process chambers 13. In addition, the robot arm 12 takes out a substrate after being processed from one of the process chambers 13 and transfers the substrate into another one of the process chambers 13 or one of the load lock chambers 14.

Each of the sensors 20 is arranged in the vicinity of connection portions between the vacuum transfer chamber 11 and the load lock chambers 14. Thus, when the substrate is taken out from the load lock chambers 14 by the robot arm 12, the sensor 20 can quickly acquire sensing information on the substrate. In the present embodiment, two sensors 20 are provided for each of the load lock chambers 14. Three or more sensors 20 may be provided for each of the load lock chambers 14.

Figure 2:
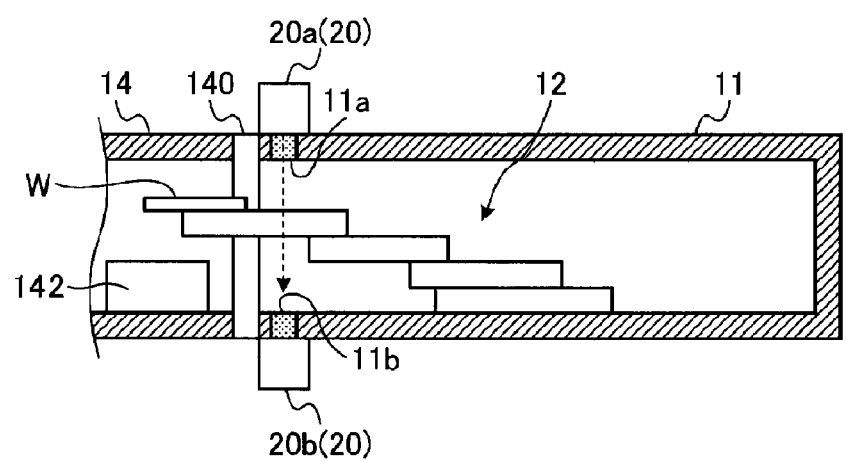
FIG. 2 is a view illustrating an example of a section of a load lock chamber and a vacuum transfer chamber.

FIG. 2 is a view illustrating an example of a section of the load lock chamber 14 and the vacuum transfer chamber 11. Each sensor 20 has a light source 20a and a light receiving sensor 20b. The light source 20a and the light receiving sensor 20b are installed outside the vacuum transfer chamber 11 at the upper and the lower portions of the vacuum transfer chamber 11, respectively. In this embodiment, the light source 20a is installed at the upper portion of the vacuum transfer chamber 11, and the light receiving sensor 20b is installed at the lower portion of the vacuum transfer chamber 11. However, the light source 20a may be installed at the lower portion of the vacuum transfer chamber 11, and the light receiving sensor 20b may be installed at the upper portion of the vacuum transfer chamber 11.

The light source 20a emits light to the inside of the vacuum transfer chamber 11 through a window 11a installed in the upper wall of the vacuum transfer chamber 11. The light source 20a emits, for example, a laser light to the inside of the vacuum transfer chamber 11. The light receiving sensor 20b receives the light emitted from the light source 20a through a window 11b installed in the lower wall of the vacuum transfer chamber 11. The windows 11a and 11b are made of a light transmitting material such as quartz. The light receiving sensor 20b outputs, as sensing information, information indicating whether or not the light emitted from the light source 20a is blocked to the control device 100. A region irradiated with the light from the light source 20a is an example of a sensing region.

A loader module 15 is connected to the load lock chambers 14. A robot arm 150 is installed in the loader module 15. The loader module 15 is provided with a plurality of load ports 16 to which containers accommodating a plurality of substrates before or after being processed (e.g., front opening unified pods (FOUPs)) are connected, respectively. The robot arm 150 takes out a substrate before being processed from one of the containers connected to one of the load port 16 and transfers the substrate into one of the load lock chamber 14. In addition, the robot arm 150 takes out a substrate after being process from one of the load lock chambers 14 having the internal pressure returned to the atmospheric pressure, and transfers the substrate into one of the containers connected to one of the load ports 16. The loader module 15 may also be provided with an alignment unit that adjusts orientation of the substrate taken out from one of the containers connected to one of the load ports 16.

[Method of Specifying Center Position of Substrate]

Figure 3:
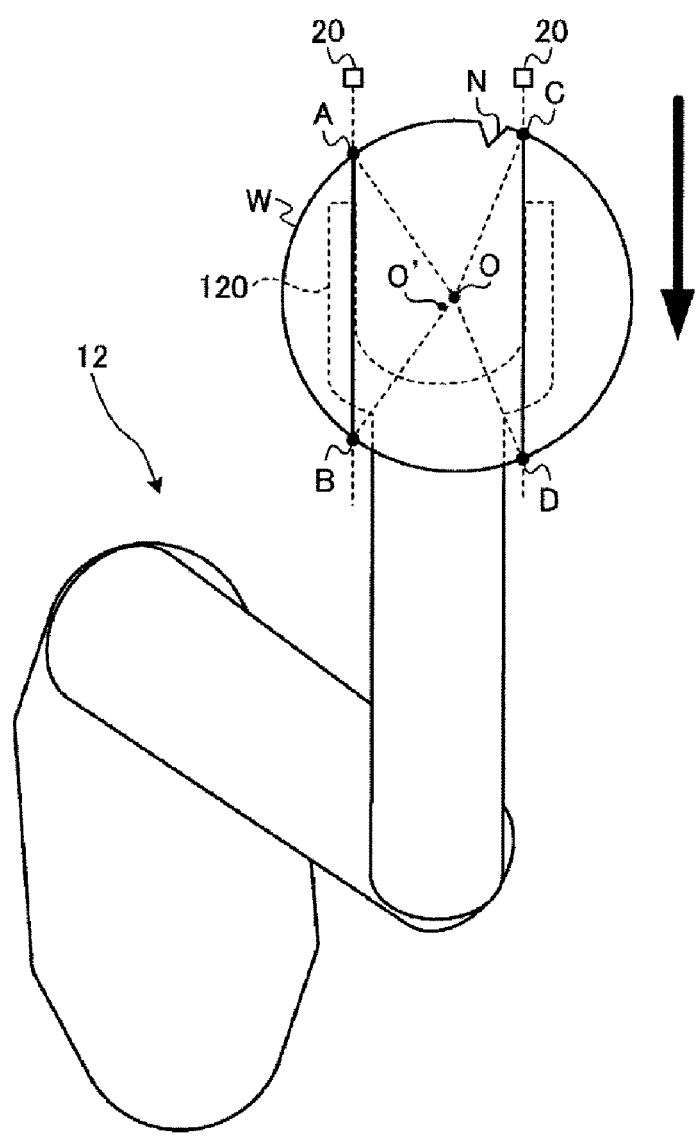
FIG. 3 is a view for explaining an example of a method of specifying a center position of a substrate.

FIG. 3 is a view for explaining an example of a method of specifying a center position of a substrate. When a substrate W is taken out from the load lock chamber 14 by the robot arm 12, the sensors 20 output sensing information to the control device 100. When the substrate W disposed on the fork 120 at the tip end of the robot arm 12 passes through the sensing region, for example, as illustrated by solid lines in FIG. 3, the light emitted from the light sources 20a is blocked in a line segment AB and a line segment CD on the substrate W. Based on the sensing information output from the sensors 20 and the position information of the fork 120, the control device 100 specifies the center of a circle passing through at least three points among the points A to D as the center position O of the substrate W. The position information of the fork 120 is specified based on, for example, the length of each of the arms of the robot arm 12 and the angle of each of the articulations. In the example of FIG. 3, the center position O of the substrate W and a reference position O' of the fork 120 deviate from each other.

Depending on the position and orientation of the substrate W with respect to the fork 120, a notch N in the substrate W may pass through the sensing region or the light may be blocked by the fork 120 when the substrate W moves. In this case, the position of the center of the circle passing through all the points A to D may be different from the center position O of the substrate W, or there may be no circle passing through all the points A to D. Therefore, in some embodiments, when the center position of one circle among four circles obtained by four different combinations of three points among the four points A to D is separated from the center positions of two or more circles among the remaining of the four circles by distances less than a predetermined distance, the center position of the one circle may be specified as the center position O of the substrate W. The notch N formed in the substrate W is an example of a marker indicating the reference direction of the substrate W. In addition, the marker indicating the reference direction of the substrate W may be an orientation flat formed on the substrate W.

[Method of Specifying Direction of Substrate]

Figure 4:
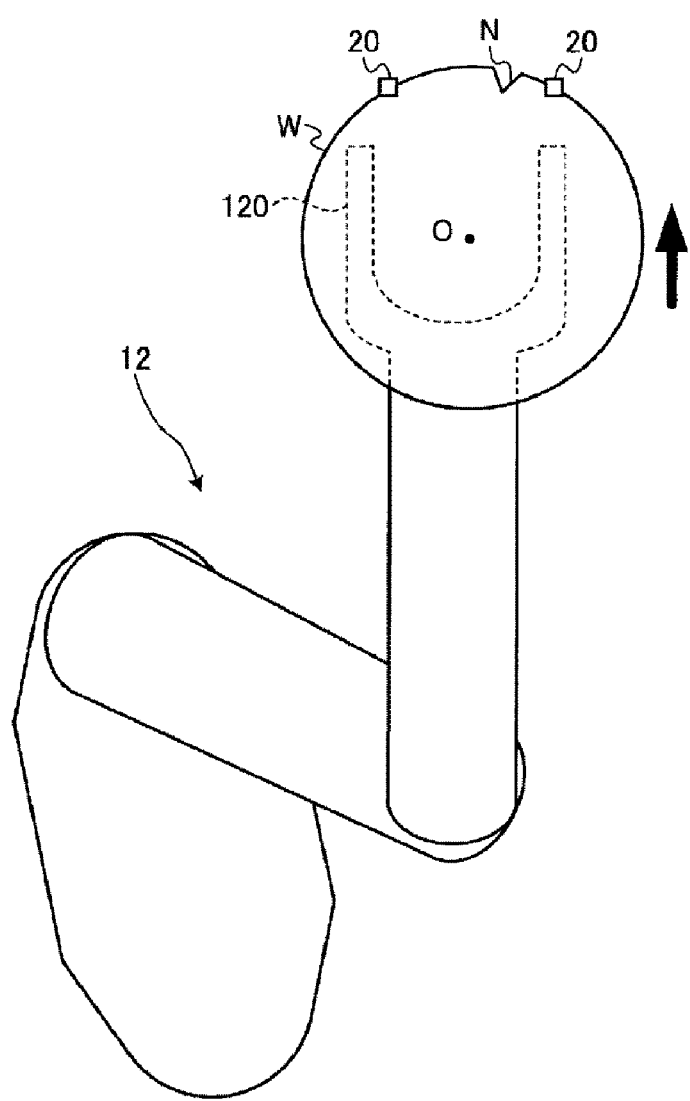
FIG. 4 is a view for explaining an example of a method of specifying a direction of the substrate in the first embodiment.
Figure 5:
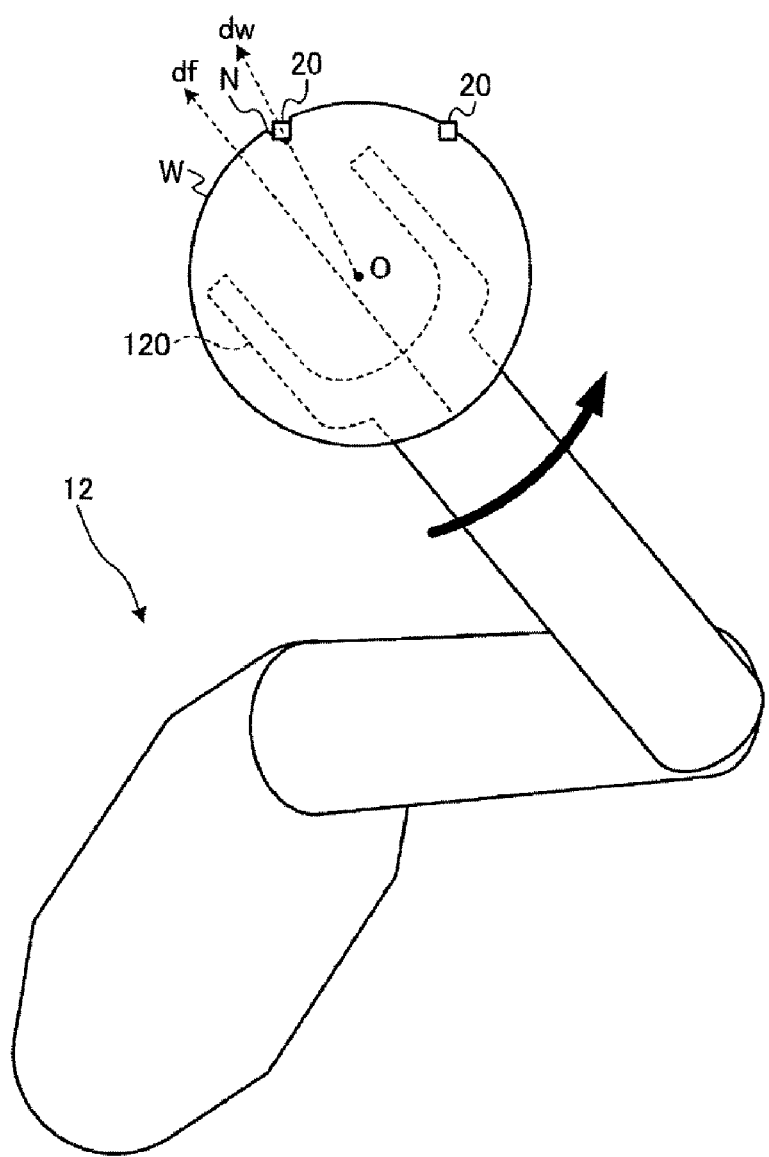
FIG. 5 is a view for explaining an example of a method of specifying a direction of a substrate in the first embodiment.

FIGS. 4 and 5 are views for explaining an example of a method of specifying the direction of the substrate W in the first embodiment. After the center position O of the substrate W with respect to the fork 120 is specified, the control device 100 controls the robot arm 12 to move the substrate W such that the edge of the substrate W is located within at least one sensing region. In this embodiment, the control device 100 moves the substrate W such that the edge of the substrate W is located in the sensing region of each of two sensors 20, as illustrated in FIG. 4, for example.

Then, the control device 100 controls the robot arm 12 to rotate the substrate W about the center position O of the substrate W, as illustrated in FIG. 5, for example. Since the substrate W rotates about the center position O, the edge of the substrate W passes through the sensing region of each of the sensors 20. Thus, the notch N of the substrate W passes through the sensing region of one of the sensors 20. Based on the sensing information output from the sensors 20, the control device 100 specifies the direction dw of the substrate W with respect to the direction df of the fork 120.

In this embodiment, since the number of independently driven articulations of the robot arm 12 is three or more, the robot arm 12 can rotate the fork 120 about an arbitrary position. Thus, the direction of the notch N of the substrate W with respect to the direction of the fork 120 may be specified using at least one sensor 20. The rotation angle of the substrate W by the robot arm 12 is limited by an inherently limited movable range of the arm of the robot arm 12. However, by detecting the notch N of the substrate W using a plurality of sensors 20, it is possible to detect the notch N in a wider range of angles.

Figure 6:
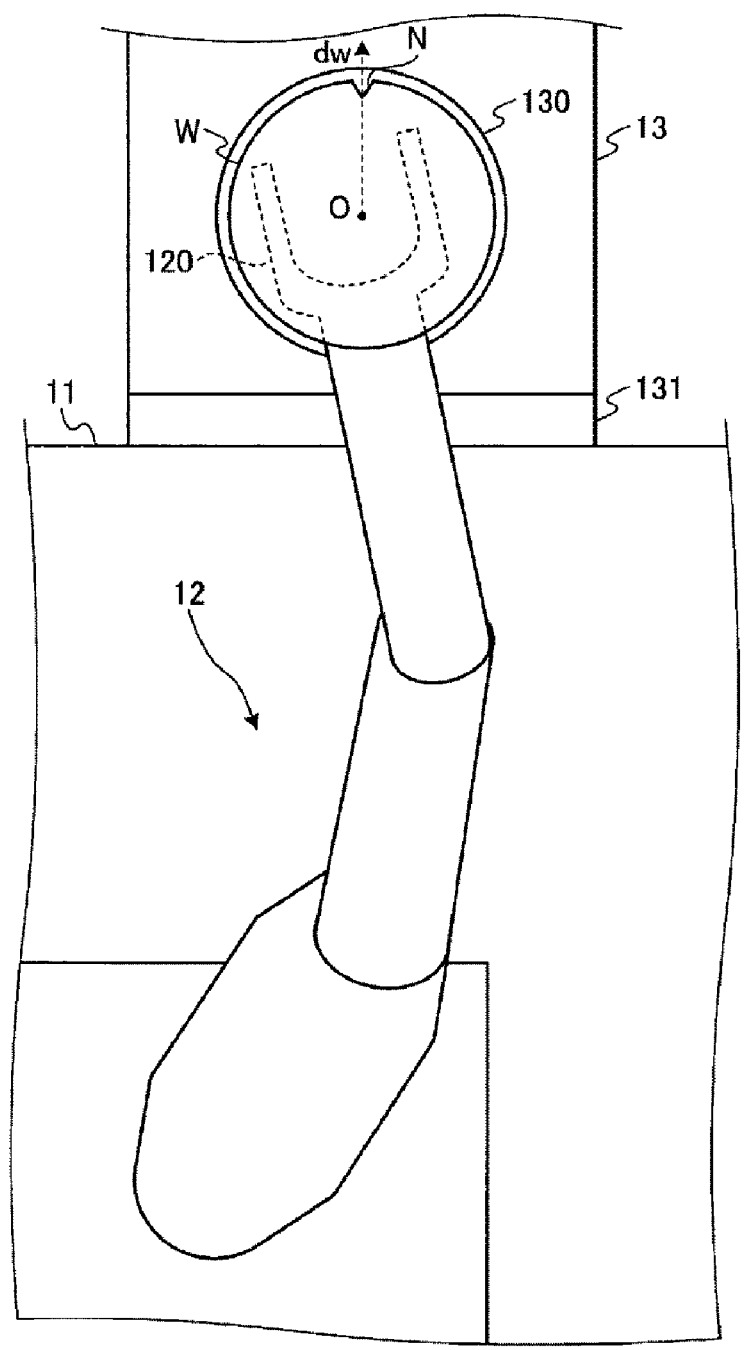
FIG. 6 is a view for explaining an example of substrate transfer to a corrected position and in a corrected direction.

Based on the center position O of the substrate W with respect to the reference position O' of the fork 120 and the direction dw of the substrate W with respect to the direction df of the fork 120, the control device 100 calculates correction amounts in the position and direction of the fork 120 for placing the substrate W at a predetermined position. The predetermined position is, for example, a position on a stage 130 in the process chamber 13. Then, the control device 100 controls the robot arm 12 to have the center position and direction according to the calculated correction amounts. Then, the substrate W disposed on the fork 120 having the corrected position and direction is placed on the stage 130 in the process chamber 13 by the lift pins, as illustrated in FIG. 6, for example.

[Transfer Sequence of Substrate W]

Figure 7:
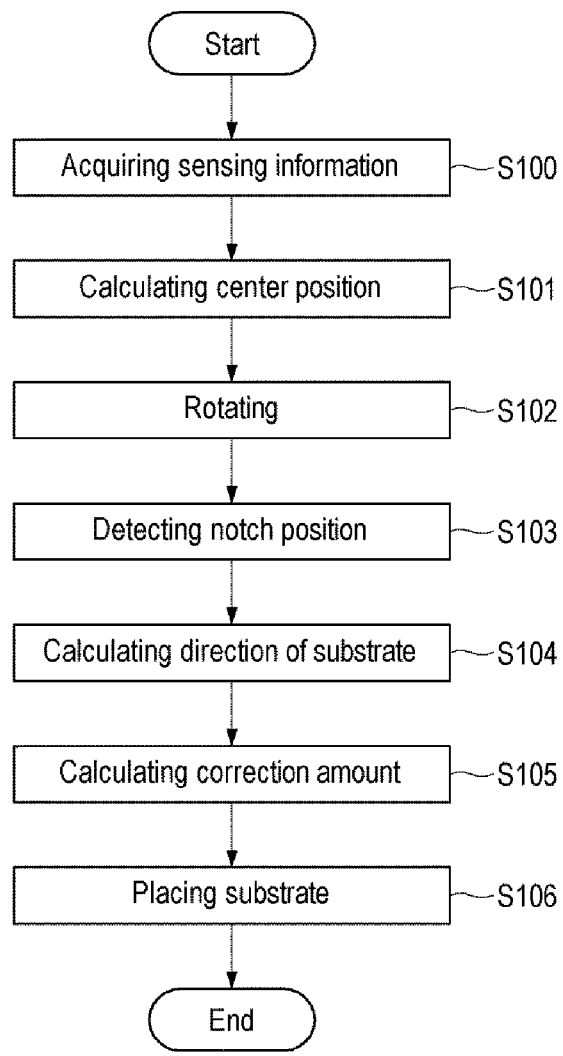
FIG. 7 is a flowchart illustrating an example of a substrate transfer sequence in the first embodiment.

FIG. 7 is a flowchart showing an example of a transfer sequence of the substrate W in the first embodiment.

First, the control device 100 controls the robot arm 12 to take out the substrate W from the load lock chamber 14 and to cause the substrate W to pass through the sensing region. The sensor 20 outputs sensing information indicating whether or not light is blocked by the substrate W to the control device 100. The control device 100 acquires the sensing information from the sensor 20 (step S100). Step S100 is an example of a sensing information acquisition step.

Next, the control device 100 calculates the center position O of the substrate W based on the sensing information output from the sensor 20 and the position information of the fork 120 (step S101). Step S101 is an example of a center position calculation step.

Next, the control device 100 moves the substrate W by controlling the robot arm 12 such that the edge of the substrate W is positioned in the sensing region. Then, the control device 100 controls the robot arm 12 to rotate the substrate W about the center position O of the substrate W (step S102). The sensor 20 outputs the sensing information to the control device 100.

Next, the control device 100 specifies the position of the notch N of the substrate W based on the sensing information when the substrate W is rotated (step S103). Step S103 is an example of a marker detection step. Then, the control device 100 calculates the direction dw of the substrate W with respect to the direction df of the fork 120 (step S104). Step S104 is an example of a direction calculation step.

Next, based on the center position O of the substrate W with respect to the reference position O' of the fork 120 and the direction dw of the substrate W with respect to the direction df of the fork 120, the control device 100 calculates correction amounts in the position and direction of the substrate W (step S105). Step S105 is an example of a correction amount calculation step.

Next, the control device 100 controls the robot arm 12 to have the center position and direction according to the calculated correction amounts, so that the substrate W is placed on the stage 130 in the process chamber 13 through the lift pins (step S106). Step S106 is an example of a placing step.

In the foregoing, the first embodiment has been described above. As is apparent from the above description, in the substrate processing system 1 of this embodiment, it is possible to accurately correct the positional and directional deviations of the substrate W using a small number of sensors 20. Thus, it is possible to reduce the number of windows for the sensor 20, which results in high airtightness of the vacuum transfer chamber 11. Further, since the small number of sensors 20 is necessary, it is possible to reduce the cost of the substrate processing system 1.

Second Embodiment

Figure 8:
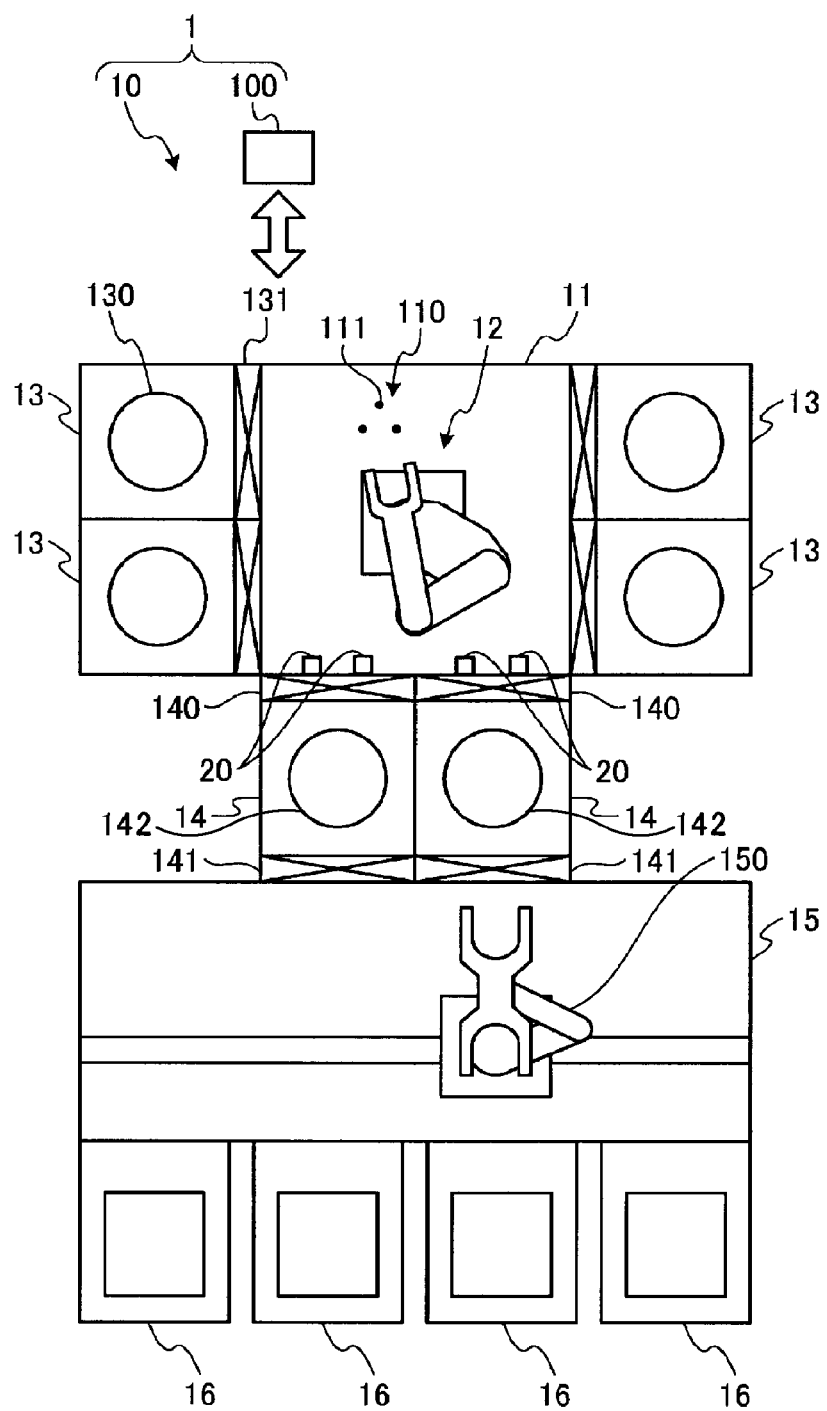
FIG. 8 is a system configuration view illustrating an example of a substrate processing system according to a second embodiment of the present disclosure.

FIG. 8 is a system configuration view illustrating an example of a substrate processing system 1 according to a second embodiment of the present disclosure. Except for the points to be described below, since the components denoted in FIG. 8 by the same reference numerals as those in FIG. 1 have the same configuration as those described with reference to FIG. 1, redundant descriptions will be omitted. In this embodiment, a temporary placement table 110 having a plurality of lift pins 111 is installed in the vacuum transfer chamber 11.

Figure 9:
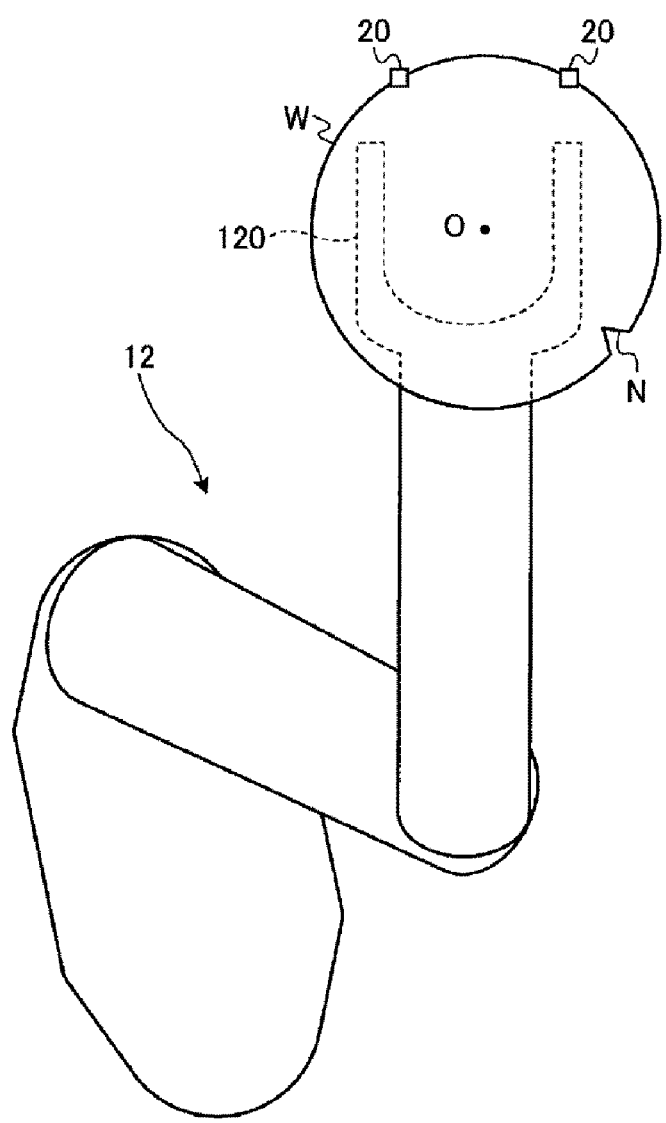
FIG. 9 is a view illustrating an example of a position of a notch.

The substrate W may be transferred into the process chamber 13 such that the notch N is positioned at the side of the gate valve 131 on the stage 130. In this case, the notch N of the substrate W taken out from the load lock chamber 14 by the robot arm 12 is positioned at the side of the arm of the robot arm 12, as shown in FIG. 9, for example. In some cases, the notch N of the substrate W may also be positioned at the side of the arm of the robot arm 12 due to deviation of the substrate W with respect to the fork 120 by the movement of the fork 120. In such cases, it is difficult to rotate the substrate W such that the notch N of the substrate W passes through the sensing region by the operation of the robot arm 12 only.

Therefore, in the substrate processing system 1 of this embodiment, when the notch N is not detected even if the substrate W is rotated about the center position O by an angle equal to or greater than a predetermined angle, the direction of the substrate W is changed by re-holding the substrate W using the temporary placement table 110 installed in the vacuum transfer chamber 11. In the example of FIG. 8, the temporary placement table 110 has three lift pins 111, but the temporary placement table 110 may have four or more lift pins 111.

Figure 10:
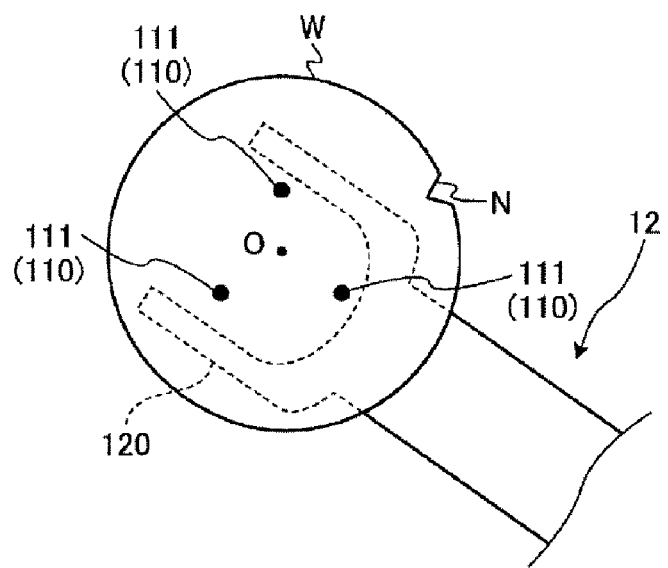
FIG. 10 is a view illustrating an example of an operation of placing a substrate on a temporary placement table.

The control device 100 controls the robot arm 12 to change the direction of the substrate W with respect to the direction of the fork 120 by temporarily placing the substrate W on the temporary placement table 110 and re-hold the substrate W. Specifically, the control device 100 moves the plurality of lift pins 111 downward, and controls the robot arm 12 such that the substrate W disposed on the fork 120 is positioned above the plurality of lift pins 111. Then, the control device 100 moves the plurality of lift pins 111 upward. Thus, the substrate W is temporarily placed on the plurality of lift pins 111, as illustrated in FIG. 10, for example.

Figure 11:
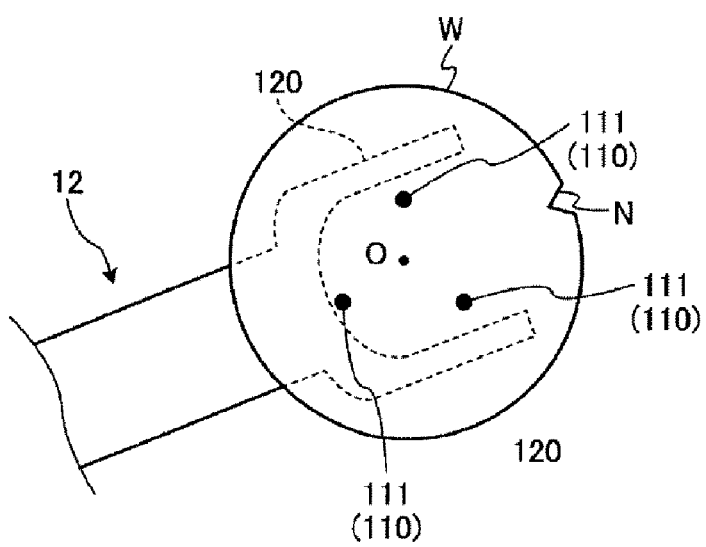
FIG. 11 is a view illustrating an example of an operation of taking out the substrate placed on the temporary placement table.

Then, the control device 100 causes the fork 120 to be inserted below the substrate W such that the direction of the fork 120 with respect to the substrate W is different from the direction of the fork 120 with respect to the substrate W before the substrate W is temporarily placed on the plurality of lift pins 111. Then, the control device 100 moves the plurality of lift pins 111 down. Thus, as illustrated in FIG. 11, for example, the direction of the substrate W with respect to the direction of the fork 120 is changed. When the temporarily placed substrate W is taken out from the lift pins 111, the control device 100 may adjust the positions of the substrate W and the fork 120 such that the center position O of the substrate W and the reference position O' of the fork 120 coincide with each other.

[Transfer Sequence of Substrate W]

Figure 12:
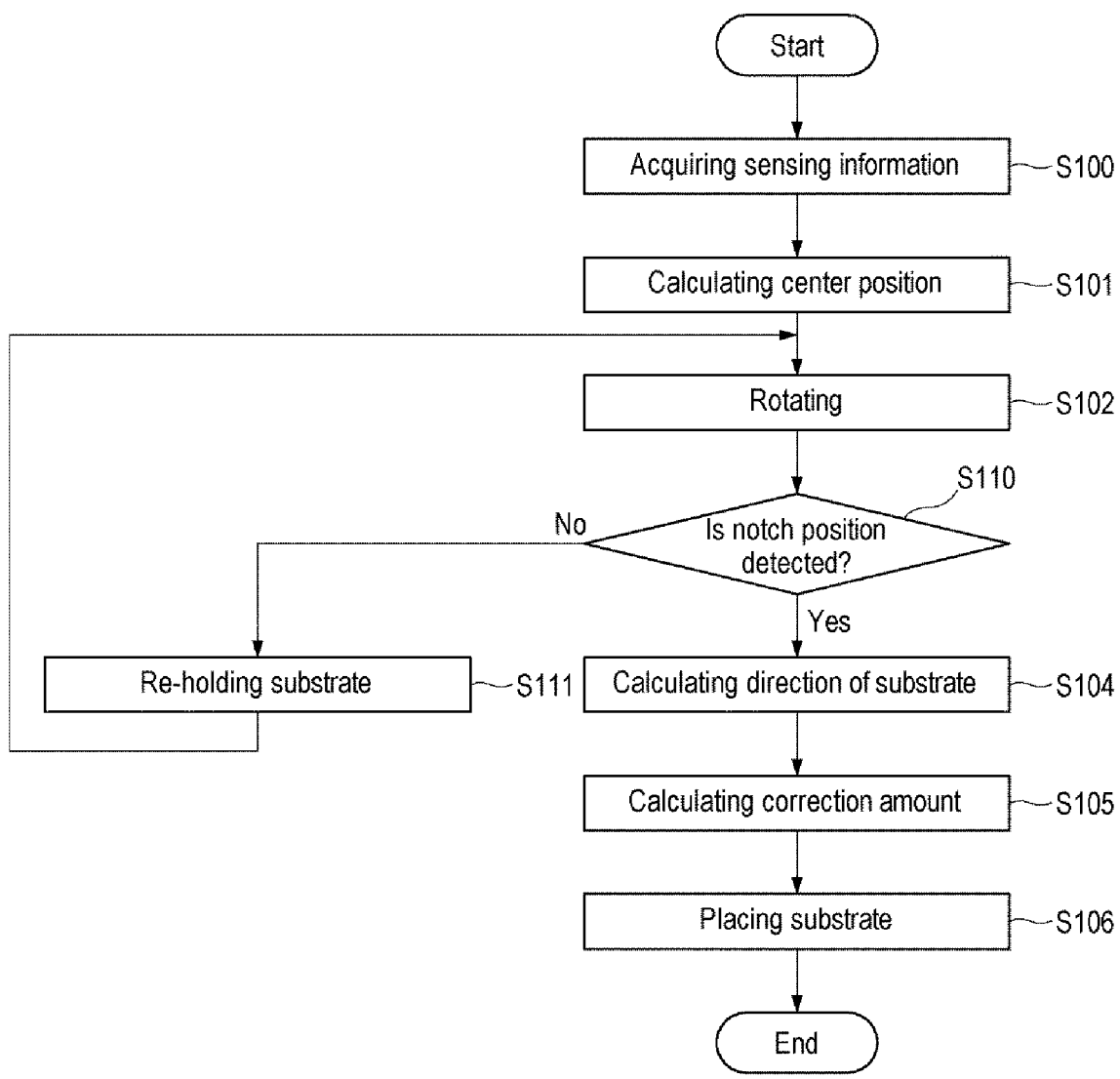
FIG. 12 is a flowchart illustrating an example of a substrate transfer sequence in the second embodiment.

FIG. 12 is a flowchart illustrating an example of a transfer sequence of the substrate W in the second embodiment. Except for the points to be described below, since the processes denoted in FIG. 12 by the same reference numerals as those in FIG. 7 are the same as those described with reference to FIG. 7, redundant descriptions will be omitted.

After rotating the substrate W in step S102, the control device 100 determines whether or not the position of the notch N has been detected with reference to the sensing information output from the sensor 20 (step S110). When the position of the notch N is detected ("Yes" in step S110), the process of step S104 is executed.

Meanwhile, when the position of the notch N is not detected ("No" in step S110), the control device 100 controls the robot arm 12 to re-hold the substrate W by temporally placing the substrate W on the temporary placement table 110 (step S111). Then, the process of step S102 is executed again. Step S111 is an example of a re-hold step.

When the control device 100 knows in advance that it is difficult to rotate the substrate W such that the notch N passes through the sensing region by the operation of the robot arm 12 only, the process of step S111 may be executed once or more before step S102.

When the notch is not detected in step S110 by executing step S111 a predetermined number of times, the control device 100 may notify occurrence of an error to, for example, an administrator of the substrate processing system 1. The predetermined number of times is, for example, the number of times that makes a cumulative value of change in angle of the direction of the substrate W exceed 360 degrees. When the notch is not detected, the substrate W is returned to the container connected to the load port 16 through the load lock chamber 14 and the loader module 15.

In the foregoing, the second embodiment has been described above. As is apparent from the above description, in the substrate processing system 1 of this embodiment, it is possible to more accurately correct the positional and directional deviations of the substrate W while securing airtightness of the vacuum transfer chamber 11. In addition, according to the substrate processing system 1 of the present embodiment, it is possible to detect the notch N at an arbitrary position on the substrate W by re-holding the substrate W. For example, when the position of the arm portion of the robot arm 12 overlaps the position of the notch N in the vertical direction, it is difficult to detect the position of the notch N using the sensor 20 that detects whether or not light is blocked. In contrast, in the substrate processing system 1 of this embodiment, the direction of the substrate W with respect to the direction of the fork 120 is changed by re-holding the substrate W. Thus, the notch N can be led to a state in which the position of the arm portion of the robot arm 12 and the position of the notch N do not overlap with each other in the vertical direction. Accordingly, it is possible to detect the notch N at an arbitrary position in the substrate W.

Third Embodiment

Figure 13:
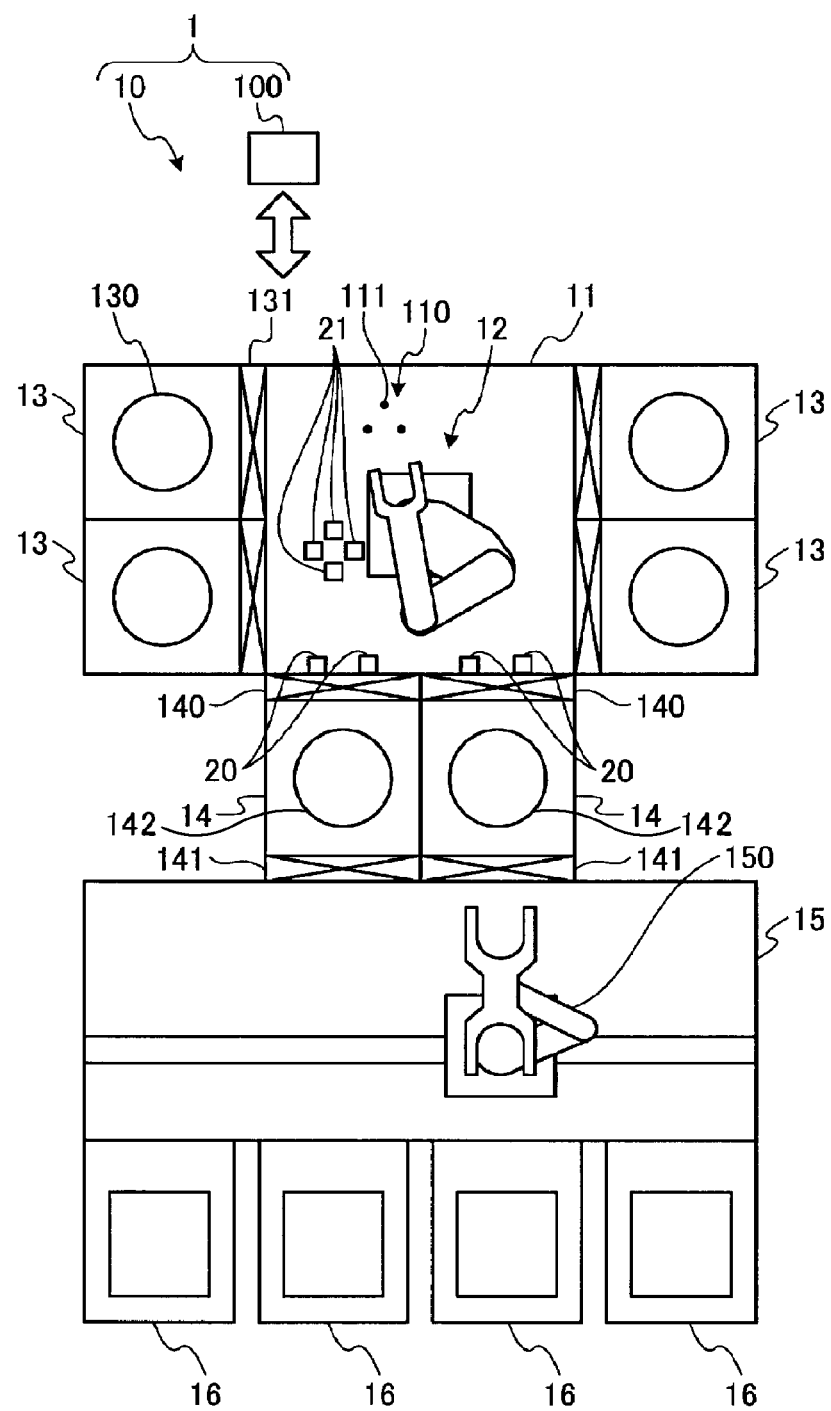
FIG. 13 is a system configuration view illustrating an example of a substrate processing system according to a third embodiment of the present disclosure.

FIG. 13 is a system configuration view illustrating an example of a substrate processing system 1 according to a third embodiment of the present disclosure. Except for the points to be described below, since the components denoted in FIG. 8 by the same reference numerals as those in FIG. 1 have the same configuration as those described with reference to FIG. 8, redundant descriptions will be omitted.

In the substrate processing system 1 according to this embodiment, in addition to the plurality of sensors 20, a plurality of sensors 21 configured to detect the position of the notch N of a substrate W is installed in the vacuum transfer chamber 11. The plurality of sensors 21 is arranged at equal intervals on the circumference of a circle having the same diameter as the diameter of the substrate W. In the example of FIG. 13, four sensors 21 are installed, but the number of the sensors 21 may be three or less, or five or more.

In this embodiment, like the sensors 20, each of the sensors 21 has a light source and a light receiving sensor installed outside the vacuum transfer chamber 11. Light from the light source of the sensor 21 is irradiated into the vacuum transfer chamber 11 through a window installed in the upper portion of the vacuum transfer chamber 11 and is received by the light receiving sensor of the sensor 21 through a window installed in the lower wall of the vacuum transfer chamber 11. The region irradiated with the light from the light source of the sensor 21 is an example of a sensing region. The light receiving sensor of the sensor 21 outputs, as sensing information, information indicating whether or not the light emitted from the light source of the sensor 21 is blocked to the control device 100.

In this embodiment, the control device 100 specifies the center position O of the substrate W based on the sensing information output from the sensor 20 when the substrate W is taken out from the load lock chamber 14 by the robot arm 12. Then, as illustrated in FIG. 14, for example, the control device 100 controls the robot arm 12 to move the substrate W such that the edge of the substrate W is located in the sensing region of each of the sensors 21.

Figure 15:
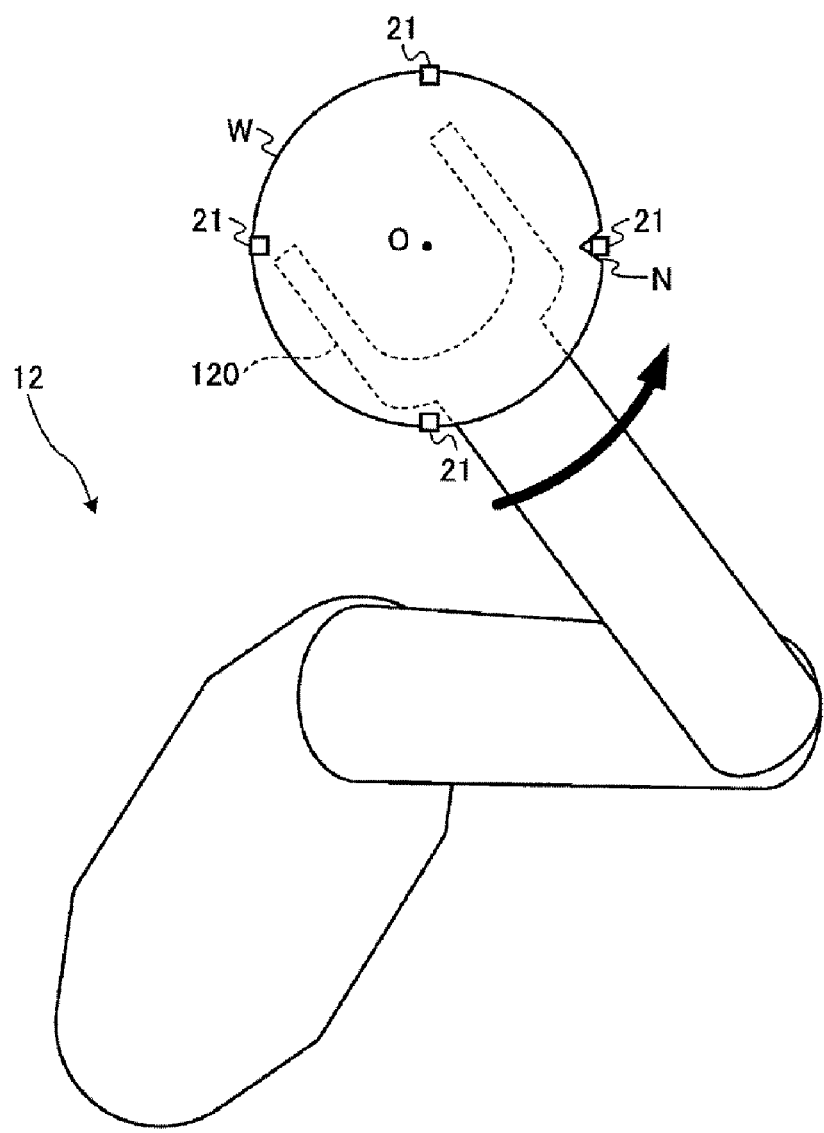
FIG. 15 is a view for explaining an example of a method of specifying a direction of a substrate in the third embodiment.

Then, as illustrated in FIG. 15, for example, the control device 100 controls the robot arm 12 to rotate the substrate W about the center position O of the substrate W. Since the substrate W rotates about the center position O, the edge of the substrate W passes through the sensing region of each of the sensors 21. Thus, the notch N of the substrate W is detected by one of the sensors 21. Accordingly, the control device 100 can detect the position of the notch N of the substrate W more quickly.

Figure 14:
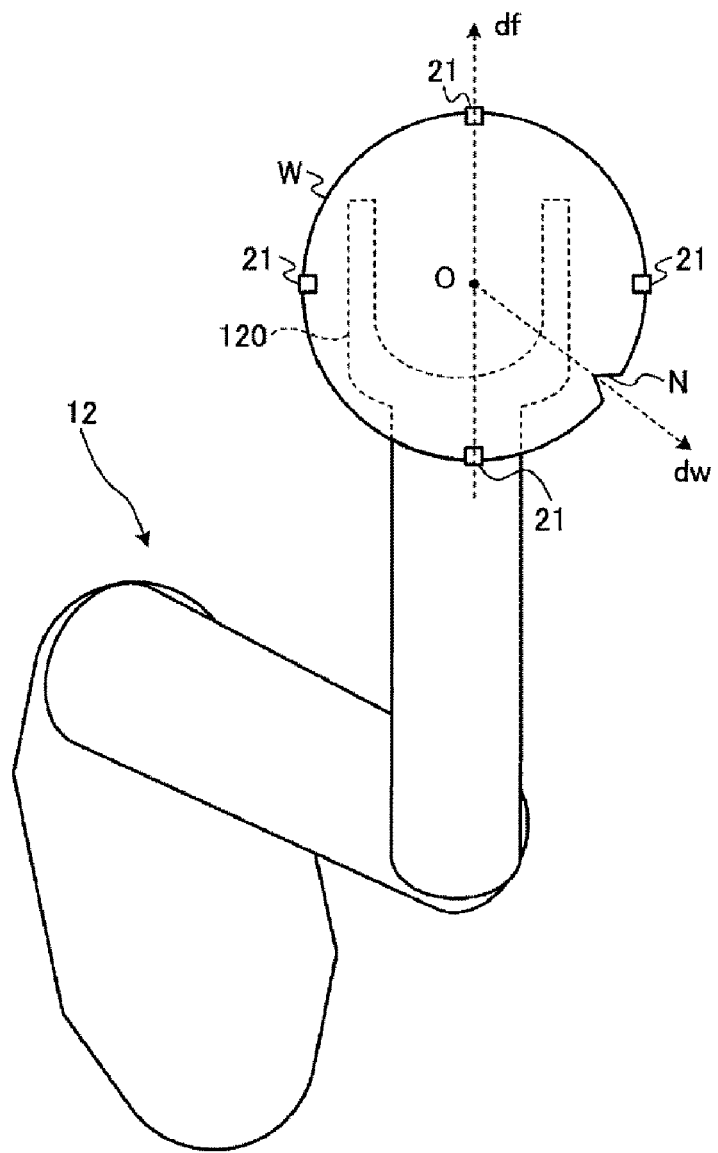
FIG. 14 is a view for explaining an example of a method of specifying a direction of a substrate in the third embodiment.

When the direction df of the fork 120 and the direction dw of the substrate W are in a relationship as illustrated in FIG. 14, for example, it is difficult to transfer the substrate W into the process chamber 13 as illustrated in FIG. 6, for example. In this case, after detecting the position of the notch N of the substrate W, the control device 100 executes re-holding of the substrate W using the temporary placement table 110.

In the foregoing, the third embodiment has been described above. As is apparent from the above description, in the substrate processing system 1 of this embodiment, it is possible to more accurately correct the positional and directional deviations of the substrate W while securing airtightness of the vacuum transfer chamber 11. In addition, according to the substrate processing system 1 of this embodiment, it is possible to detect the position of the notch N of the substrate W more quickly.

[Hardware]

Figure 16:
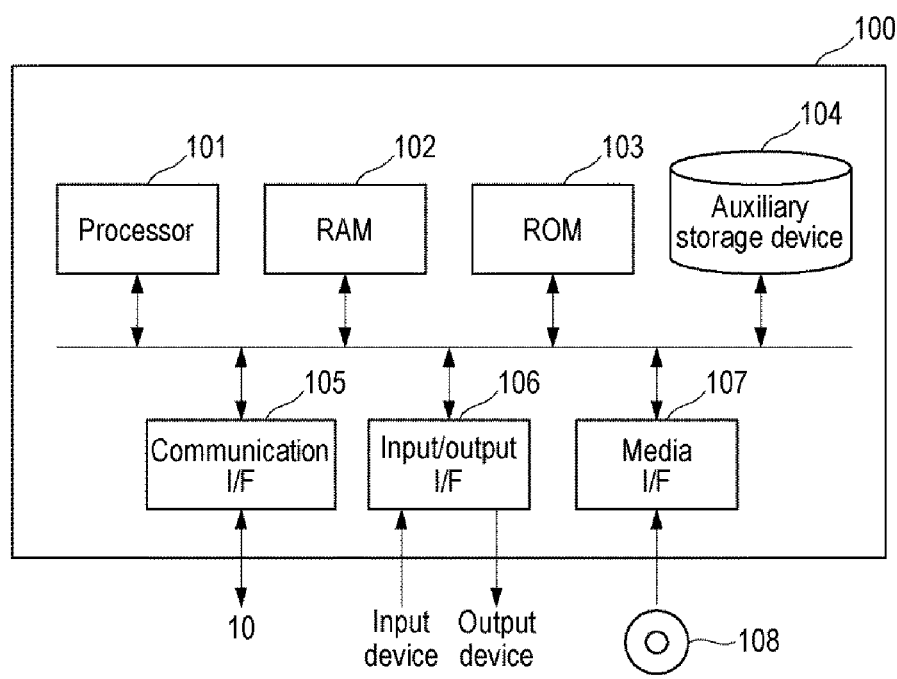
FIG. 16 is a view illustrating an example of hardware of a control device.

FIG. 16 is a view illustrating an example of hardware of the control device 100. The control device 100 in the first to third embodiments described above is implemented by, for example, hardware illustrated in FIG. 16. The control device 100 includes a processor 101, a RAM 102, a ROM 103, an auxiliary storage device 104, a communication interface (I/F) 105, an input/output interface (I/F) 106, and a media interface (I/F) 107.

The processor 101 operates based on a program stored in the ROM 103 or the auxiliary storage device 104, and controls each component of the main body 10. The ROM 103 stores, for example, a boot program executed by the processor 101 when the control device 100 starts up, or a program depending on the hardware of the control device 100.

The auxiliary storage device 104 is, for example, a hard disk drive (HDD) or a solid state drive (SSD), and stores for example, a program executed by the processor 101 and data used by the program. The processor 101 reads the program from the auxiliary storage device 104, loads the program on the RAM 102, and executes the loaded program.

The communication I/F 105 performs communication with the main body 10 via a communication line such as a local area network (LAN). The communication I/F 105 receives data from the main body 10 via the communication line and transmits the data to the processor 101. The communication I/F 105 also transmits data generated by the processor 101 to the main body 10 via the communication line. The processor 101 acquires sensing information from, for example, the sensors 20 and the sensors 21 via the communication I/F 105. Further, the processor 101 transmits a control signal for driving the robot arm 12, for example, to the robot arm 12 via the communication I/F 105.

The processor 101 controls an input device such as a keyboard and an output device such as a display via the input/output I/F 106. The processor 101 acquires a signal input from the input device via the input/output I/F 106 and generates data based on the signal. In addition, the processor 101 outputs the generated data to the output device via the input/output I/F 106.

The media I/F 107 reads a program or data stored in a recording medium 108, and stores the program or data in the auxiliary storage device 104. The recording medium 108 may be, for example, an optical recording medium such as a digital versatile disk (DVD) and a phase change rewritable disk (PD), a magneto-optical recording medium such as magneto-optical (MO) disk, a tape medium, a magnetic recording medium, or a semiconductor memory.

The processor 101 of the control device 100 controls each component of the main body 10 by executing the program loaded on the RAM 102. The processor 101 reads the program loaded on the RAM 102 from the recording medium 108, and stores the program in the auxiliary storage device 104. As another example, the processor 101 acquires a program from another device via a communication line, and store the program in the auxiliary storage device 104. Alternatively, the processor 101 may load a program acquired from another device via a communication line on the RAM 102, and execute the acquired program without storing the acquired program in the auxiliary storage device 104.

[Others]

The present disclosure is not limited to the above-described embodiments, and various modifications can be made within the scope of the gist of the present disclosure.

For example, in each of the embodiments described above, the sensors 20 are installed in the vicinity of the connection portions between the vacuum transfer chamber 11 and the load lock chambers 14, but the present disclosure is not limited thereto. The sensors 20 may be disposed at any places in which light can pass through the vacuum transfer chamber 11 in the vertical direction. For example, in the case in which the sensors 20 are disposed at positions away from the load lock chambers 14, even if the doors 140 of the load lock chambers 14 are closed, the control device 100 may specify the center position O and direction of the substrate W using the sensors 20.

In each of the embodiments described above, the positional and directional deviations of the substrate W are corrected when the substrate W is loaded from the load lock chamber 14 into the process chamber 13, but the present disclosure is not limited thereto. For example, when the substrate W after being processed by one process chamber 13 is loaded into another process chamber 13 that performs a treatment different from that in the one process chamber 13, the positional and directional deviations of the substrate W may also be corrected. In this case, the sensors 20 may be installed in the vicinity of the connection portions between the vacuum transfer chamber 11 and the process chambers 13. With this configuration, it is possible to quickly specify the center position O of the substrate W when the substrate W is unloaded from the process chamber 13. The one process chamber 13 is an example of a first processing chamber and the other process chamber 13 is an example of a second processing chamber. The positional and directional deviations of the substrate W may also be corrected when the substrate W after being processed is returned to the load lock chamber 14.

In each of the above-described embodiments, each of the sensors 20 includes a light source and a light receiving sensor, and outputs, as sensing information, information indicating whether or not light is blocked by the substrate W to the control device 100. However, the present disclosure is not limited thereto, and the sensor 20 may be, for example, a camera. When the sensor 20 is a camera, the sensor 20 images the substrate W from above through the window installed at the upper portion of the vacuum transfer chamber 11. With this configuration, it is unnecessary to install a window in the lower portion of the vacuum transfer chamber 11. Thus, it is possible to further enhance the airtightness of the vacuum transfer chamber 11.

In the second embodiment and the third embodiment described above, the temporary placement base 110 is installed in the vacuum transfer chamber 11, but the present disclosure is not limited thereto. For example, a stage 142 in the load lock chamber 14 or the stage 130 in the process chamber 13 may be used instead of the temporary placement table 110. With this configuration, it is unnecessary to secure a space for installing the temporary placement base 110 in the vacuum transfer chamber 11. Thus, it is possible to downsize the vacuum transfer chamber 11.

In each of the above-described embodiments, the plurality of sensors 20 are installed in the vacuum transfer chamber 11, but the present disclosure is not limited thereto and the number of the sensors 20 installed in the vacuum transfer chamber 11 may be one. When the number of the sensors 20 is one, the control device 100 calculates the center position O of the substrate W, based on position information of two points on the edge of the substrate W included in the sensing information detected by the sensor 20 and preset information on the radius of the substrate W. Further, when the directional deviation of the substrate W is small, the control device 100 may detect the position of the notch N by rotating the substrate W about the center position O of the substrate W in the state in which the edge of the substrate W is located in the sensing region.

According to various aspects and embodiments of the present disclosure, it is possible to accurately correct the positional deviation of a substrate while securing the airtightness of a vacuum transfer chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transfer method comprising:
acquiring sensing information from at least one sensor by moving a substrate by a robot arm such that the substrate passes through a sensing region, wherein the robot arm is disposed in a vacuum transfer chamber and the sensing region is a region located in the vacuum transfer chamber and sensed by the at least one sensor;
calculating a center position of the substrate with respect to the robot arm based on the sensing information;
controlling the robot arm to rotate the substrate about the center position in a state in which an edge of the substrate is located in the sensing region to detect a marker indicating a reference direction of the substrate by the at least one sensor;
calculating a direction of the substrate with respect to the robot arm based on a position of the marker;
calculating a correction amount for use in placing the substrate on a stage in a processing chamber connected to the vacuum transfer chamber based on the center position of the substrate and the direction of the substrate; and
placing the substrate on the stage in the processing chamber such that the center position of the substrate and the direction of the substrate are corrected according to the correction amount.

2. The substrate transfer method of claim 1, wherein the robot arm has three or more articulations, each of which is independently driven.

3. The substrate transfer method of claim 1, wherein the at least one sensor includes:
- a light source installed outside the vacuum transfer chamber and configured to irradiate light into the vacuum transfer chamber, and
- a light receiving sensor installed outside the vacuum transfer chamber and configured to receive the light irradiated from the light source through the vacuum transfer chamber, and
- wherein the step of acquiring the sensing information further includes acquiring, as the sensing information, information indicating whether or not the light irradiated from the light source is blocked by the substrate.

4. The substrate transfer method of claim 3, wherein the at least one sensor includes two or more sensors installed outside the vacuum transfer chamber.

5. The substrate transfer method of claim 1, wherein a load lock chamber is connected to the vacuum transfer chamber,
- wherein the sensing region is provided in the vicinity of a connection portion between the vacuum transfer chamber and the load lock chamber, and
- wherein the step of acquiring the sensing information further includes acquiring the sensing information from the at least one sensor when the robot arm moves the substrate from the load lock chamber to the vacuum transfer chamber.

6. The substrate transfer method of claim 1, wherein a first processing chamber and a second processing chamber are connected to the vacuum transfer chamber,
- wherein the sensing region is provided in the vicinity of a connection portion between the vacuum transfer chamber and the first processing chamber,
- wherein the step of acquiring the sensing information further includes acquiring the sensing information from the at least one sensor when the robot arm moves the substrate from the first processing chamber to the vacuum transfer chamber,
- wherein the step of calculating the correction amount further includes calculating a correction amount for use in placing the substrate on a stage in the second processing chamber, based on the center position of the substrate and the direction of the substrate, and
- wherein the step of placing the substrate further includes placing the substrate on the stage in the second processing chamber such that the center position of the substrate and the direction of the substrate are corrected according to the correction amount for use in placing the substrate on the stage in the second processing chamber.

7. The substrate transfer method of claim 1, further comprising re-holding the substrate by placing the substrate on a temporary placement table configured to temporarily place the substrate, when the marker is not detected by the at least one sensor even though the substrate is rotated by an angle equal to or greater than a predetermined angle during the step of detecting the marker.

8. The substrate transfer method of claim 7, wherein a load lock chamber is connected to the vacuum transfer chamber, and the temporary placement table is a stage installed in the load lock chamber.

9. A substrate transfer apparatus comprising:
- a vacuum transfer chamber;
- an articulated robot arm installed in the vacuum transfer chamber and configured to transfer a substrate;
- a sensor configured to detect whether or not the substrate passes through a sensing region in the vacuum transfer chamber; and
- a controller configured to control the robot arm and the sensor to:
  - acquire sensing information from the sensor by moving the substrate by the robot arm such that the substrate passes through the sensing region;
  - calculate a center position of the substrate with respect to the robot arm based on the sensing information;
  - rotate the substrate about the center position in a state in which an edge of the substrate is located in the sensing region to detect a marker indicating a reference direction of the substrate;
  - calculate a direction of the substrate with respect to the robot arm based on a position of the marker;
  - calculate a correction amount for use in placing the substrate on a stage in a processing chamber connected to the vacuum transfer chamber based on the center position of the substrate and the direction of the substrate; and
  - place the substrate on the stage in the processing chamber such that the center position of the substrate and the direction of the substrate are corrected according to the correction amount.

* * * * *